United States Patent [19]

McCune, Jr.

[11] Patent Number: 5,731,773
[45] Date of Patent: Mar. 24, 1998

[54] HALF-ORDER HOLD DIRECT DIGITAL FREQUENCY SYNTHESIS

[76] Inventor: Earl W. McCune, Jr., 2383 Pruneridge Ave., Suite 3, Santa Clara, Calif. 95050

[21] Appl. No.: 660,345

[22] Filed: Jun. 5, 1996

[51] Int. Cl.⁶ .................................................. H03M 1/66
[52] U.S. Cl. .................. 341/144; 341/118; 327/129; 364/718
[58] Field of Search .................................. 341/144, 118; 327/106, 107, 129; 364/718

[56] References Cited

U.S. PATENT DOCUMENTS

| | | | |
|---|---|---|---|
| 4,410,954 | 10/1983 | Wheatley, III | 364/701 |
| 4,815,018 | 3/1989 | Reinhardt et al. | 364/701 |
| 5,073,869 | 12/1991 | Bjerede | 364/718 |

Primary Examiner—Fritz Fleming
Assistant Examiner—Jason L. W. Kost
Attorney, Agent, or Firm—Burns, Doane, Swecker & Mathis, LLP

[57] ABSTRACT

A direct digital frequency synthesizer is provided that solves the problems of spurious spectra and spectral enveloping. The output of the D/A converter is gated such that a signal to be filtered is connected to circuit ground during an initial noisy portion of the D/A conversion cycle and is connected to the output terminals of the D/A converter during a later portion of the D/A conversion cycle. The spurious spectral components attributable to noisy operation of the D/A converter may therefore be largely eliminated. Furthermore, gating the output signal in this manner produces a similar effect as a decimating filter, shifting the enveloping function such that the first null occurs at a higher frequency, for example 2fc instead of fc. At the Nyquist frequency therefore, the level of the output signal is down less than one dB compared to the output signal at the lowest frequency, producing a largely flat spectral response over the frequency range of interest.

4 Claims, 2 Drawing Sheets ively, noise and non-ideal performance from the D/A converter produces additional spurious spectral components. Depending on the application, these additional spurious spectra, which may in some instances contain substantial signal energy, pose a serious problem. This problem is referred to herein as the spurious spectra problem.

5,731,773

1
HALF-ORDER HOLD DIRECT DIGITAL FREQUENCY SYNTHESIS

BACKGROUND OF THE INVENTION

1. Field of the Invention

The present invention relates to direct digital frequency synthesis, i.e., the generation of a desired analog signal using digital circuitry.

2. State of the Art

Direct digital frequency synthesis (DDFS) consists of generating a digital representation of a desired signal using logic circuitry or a digital computer, and then converting the digital representation to an analog waveform using a digital-to-analog converter. Using DDFS, systems can be compact, low power, and can provide very fine frequency resolution with virtually instantaneous switching of frequencies. DDFS is finding increased application, particularly in conjunction with phase-locked loop synthesizers.

Referring to FIG. 1, a block diagram of a conventional direct digital frequency synthesizer is shown. DDFS uses a single clock frequency from a clock 101 as a time reference. A digital value n (block 103) corresponding to a desired frequency is added to the contents of an accumulator 105 every cycle of a clock signal having a period T. The contents of the accumulator 105 are stored in a memory address register 107 and used to address a memory 109. Within the memory 109 is stored a digital representation of a cosine wave, for example. The contents of the memory 109 at the location determined by the current value of the accumulator 105 are applied to a D/A converter 111 and converted to a corresponding analog value. The D/A conversion is also usually controlled by the clock. The resulting analog signal is a stair-step approximation of a sinusoid. This signal is then filtered using a low-pass filter 113 to produce a smooth sinusoid as the final output signal of the direct digital frequency synthesizer.

Although DDFS offers important advantages over analog synthesis, DDFS continues to suffer in terms of signal quality. More particularly, because a direct digital frequency synthesizer is a discrete-time system operating at a particular clock frequency, the spectral purity of the output signal is affected. Referring to FIG. 2, although the dominant frequency component in the output signal of a direct digital frequency synthesizer occurs at the principal frequency, $f0$, additional frequency components occur about the clock frequency and multiples thereof, i.e., at $fc \pm f0$, $2fc \pm f0$, etc. These additional spectra are unavoidable in a discrete-time system and are removed by filtering. However, noise and non-ideal performance from the D/A converter produces additional spurious spectral components. Depending on the application, these additional spurious spectra, which may in some instances contain substantial signal energy, pose a serious problem. This problem is referred to herein as the spurious spectra problem.

Furthermore, because the output of the D/A converter 111 is held for one clock period (zero-order hold), the frequency spectrum is enveloped by an envelope function $\sin(x)/x$, having nulls at the clock frequency and multiples of the clock frequency. At the Nyquist frequency $f_N(=\frac{1}{2} fc)$, this enveloping causes the output signal level to be $-4$ dB as compared to the output signal level at the lowest frequency of the direct digital frequency synthesizer. Therefore, as the direct digital frequency synthesizer is tuned up and down in frequency, the level of the desired output signal varies. This problem is referred to herein as the spectral enveloping

2 problem. The spectral enveloping problem has been addressed in the prior art by causing the lowpass filter to have an opposite frequency characteristic, i.e., by providing a lowpass filter the response of which in the pass band is described by $x/\sin(x)$. Constructing such a filter entails considerable effort and expense.

Together, the problems of spurious spectra and spectral enveloping have limited the application of DDFS.

What is needed, then, is an improved direct digital frequency synthesizer that overcomes the problems of spurious spectra and spectral enveloping.

SUMMARY OF THE INVENTION

The present invention, generally speaking, provides a direct digital frequency synthesizer that solves the problems of spurious spectra and spectral enveloping. The output of the D/A converter is gated such that a signal to be filtered is connected to a reference voltage such as circuit ground, during an initial noisy portion of the D/A conversion cycle and is connected to the output terminal of the D/A converter during a later portion of the D/A conversion cycle. The spurious spectral components attributable to noisy operation of the D/A converter may therefore be largely eliminated. Furthermore, gating the output signal in this manner produces a similar effect as a decimating filter, shifting the enveloping function such that the first envelope null occurs at a higher frequency, for example 2 fc instead of fc. At the Nyquist frequency therefore, the level of the output signal is down less than 1 dB compared to the output signal at the lowest frequency, producing a largely flat spectral response over the frequency range of interest.

More particularly, in accordance with one embodiment of the invention, a direct digital frequency synthesizer includes a digital clock producing a clock signal having a clock period, an accumulator responsive to the clock signal for producing a phase value, a waveform memory for producing the contents of a memory location in response to the phase value from the accumulator, and a D/A converter, having an output terminal, responsive to the clock signal for converting the contents of the memory location to an analog voltage and producing the analog voltage at the output terminal. The direct digital frequency synthesizer is further provided with a switch responsive to the clock signal for producing an output signal by, during a first portion of the clock period, connecting the quantized output signal to a fixed voltage, such as signal ground, and, during a second portion of the clock period, connected the output signal to the output terminal of the D/A converter.

In accordance with another embodiment of the invention, a periodic signal is digitally synthesized using a digital clock, an accumulator, a waveform memory, a D/A converter and a switch, to produce an output signal. The periodic signal is produced by clocking the accumulator to produce a phase value; reading the contents of a location of the waveform memory specified by the phase value; the D/A converter converting the contents to an analog signal in accordance with a conversion cycle; and switching the output signal between a fixed voltage during a first portion of the conversion cycle and the analog signal during a second portion of the conversion cycle.

BRIEF DESCRIPTION OF THE DRAWING

The present invention may be further understood from the following description in conjunction with the appended drawing. In the drawing.

DETAILED DESCRIPTION OF THE PREFERRED EMBODIMENT

Figure 1:
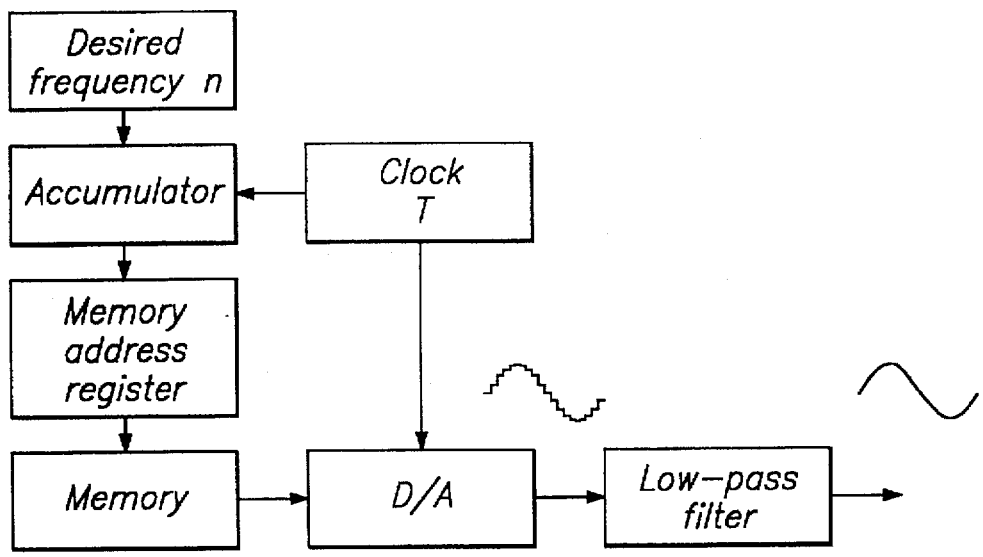
FIG. 1 is a circuit diagram of a conventional direct digital frequency synthesizer.
Figure 3:
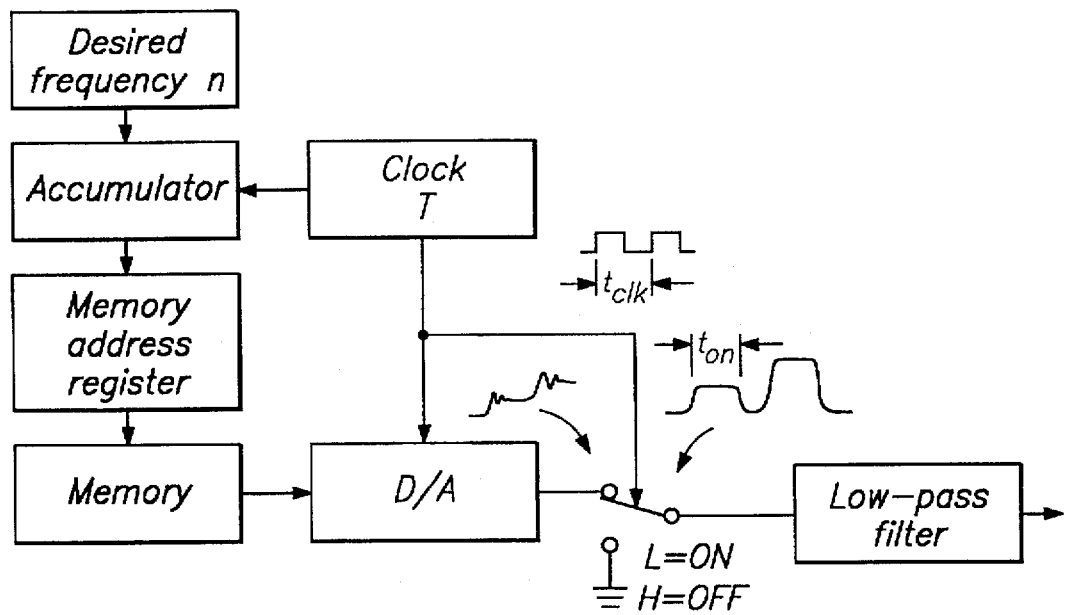
FIG. 3 is a circuit diagram of a direct digital frequency synthesizer in accordance with the present invention.
Figure 2:
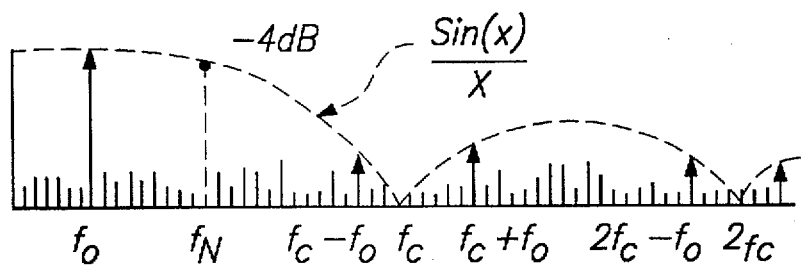
FIG. 2 is a graph of the output spectrum of the direct digital frequency synthesizer of FIG. 1.

Referring to FIG. 3, a direct digital frequency synthesizer is shown corresponding generally to FIG. 1, like elements having been assigned like reference numerals. As compared to the a direct digital frequency synthesizer of FIG. 1, in FIG. 3, a switch S1 is coupled between the output terminal of the D/A converter 111 and the input terminal of the filter 113. The switch is controlled by the clock signal or by a related clock signal. In the illustrated embodiment, the switch is controlled by the clock signal directly. Under control of the clock signal, an output terminal of the switch is connected to either a fixed voltage or to the output terminal of the D/A converter 111.

More particularly, control of the switch is phased such that during the positive half of the clock cycle when the clock signal is high, the switch is set to couple the output signal to ground. During the negative half of the clock cycle, when the clock signal is low, the switch is set to couple the output signal to the analog voltage produced by the D/A converter 111.

The D/A converter 111, on the other hand, begins its conversion cycle on the rising edge of the clock signal. Switching transients therefore occur in the positive clock cycle following the rising edge of the clock signal. During this interval, the switch is set to couple the output signal to ground. The switching transients produced on the output terminal of the D/A converter 111 are therefore not coupled through to the output signal. During the negative clock cycle, switching transients may be expected to have largely subsided. During this interval, the switch is set to couple the output signal to the output terminal of the D/A converter 111.

The duty cycle of the clock signal may be chosen in view of the noise characteristics experienced during operation of the D/A converter, such that the negative half cycle of the clock signal coincides with substantially quiet operation of the D/A converter 111.

The output signal of the switch prior to filtering alternates between circuit ground and the current output signal of the D/A converter. The on-time of the output signal, $t_{ON}$, coincides with the negative clock cycle of the clock signal.

Figure 4:
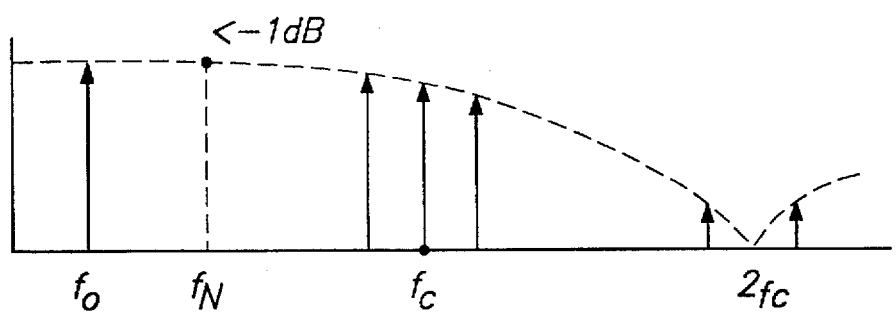
FIG. 4 is a graph of the output spectrum of the direct digital frequency synthesizer of FIG. 3.

The quantized output signal is filtered using the lowpass filter 113 to produce a final output signal. The spectral content of the final output signal is shown in FIG. 4. The spurious components attributable to noisy operation of the D/A converter are no longer present. The output signal is therefore much cleaner. Furthermore, the first null in the spectral envelope, assuming a clock signal having a 50% duty cycle, occurs at twice the clock frequency (2 fc) instead of at the clock frequency itself. In the frequency range of interest, below the Nyquist frequency, the spectral envelope is substantially flat.

Furthermore, the locations of the first null in the spectral envelope may be adjusted to provide the desired degree of flatness in the frequency range of interest, by adjusting the duty cycle of the clock signal. To shift the null upward in frequency, the on-time, $t_{ON}$, is made narrower. To shift the null downward in frequency, $t_{ON}$ is made wider.

Using the present invention, a very clean signal may be generated by direct digital frequency synthesis. The problems of spurious spectra and spectral enveloping are largely overcome.

It will be appreciated by those of ordinary skill in the art that the invention can be embodied in other specific forms without departing from the spirit or essential character thereof. The present description is therefore considered in all respects to be illustrative and not restrictive. The scope of the invention is indicated by the appended claims, and all changes that come within the meaning and range of equivalents thereof are intended to be embraced therein.

What is claimed is:

1. A direct digital frequency synthesis apparatus comprising:

a digital clock producing a clock signal having a clock period;

an accumulator responsive to the clock signal for producing a phase value;

a waveform memory for producing the contents of a memory location in response to the phase value from the accumulator;

a D/A converter, having an output terminal, responsive to the clock signal for converting the contents of the memory location to an analog voltage and producing the analog voltage at the output terminal; and a switch responsive to the clock signal for producing an output signal by, during a first substantial portion of the clock period, connecting the output signal to a fixed voltage and, during a second substantial portion of the clock period, connected the output signal to the output terminal of the D/A converter.

2. The apparatus of claim 1, further comprising a lowpass filter responsive to the output signal for producing a filtered output signal.

3. A method of digitally synthesizing a periodic signal using a digital clock, an accumulator, a waveform memory, a D/A converter and a switch, to produce an output signal, the method comprising the steps of:

clocking the accumulator to produce a phase value;

reading the contents of a location of the waveform memory specified by the phase value;

the D/A converter converting the contents to an analog signal in accordance with a conversion cycle; and switching the output signal between a fixed voltage during a first substantial portion of the conversion cycle and the analog signal during a second substantial portion of the conversion cycle.

4. The method of claim 3, comprising the further step of filtering the output signal to produce a final output signal.

* * * * *